United States Patent [19]

Merrill et al.

[11] Patent Number: 5,475,252
[45] Date of Patent: Dec. 12, 1995

[54] PROCESS FOR MANUFACTURE OF RADIATION RESISTANT POWER MOSFET AND RADIATION RESISTANT POWER MOSFET

[75] Inventors: Perry Merrill, El Segundo; Kyle A. Spring, Hawthorne, both of Calif.

[73] Assignee: International Rectifier Corporation, El Segundo, Calif.

[21] Appl. No.: 288,585

[22] Filed: Aug. 10, 1994

Related U.S. Application Data

[63] Continuation of Ser. No. 1,629, Jan. 8, 1987, Pat. No. 5,338,693.

[51] Int. Cl.⁶ .............................. H01L 29/78; H01L 23/48
[52] U.S. Cl. .................... 257/341; 257/336; 257/471; 257/476; 257/607
[58] Field of Search ................................ 257/341, 336, 257/471, 476, 607

[56] References Cited

U.S. PATENT DOCUMENTS

| | | | |
|---|---|---|---|
| 4,364,073 | 12/1982 | Becke et al. | 357/43 |
| 4,495,513 | 1/1985 | Descamps | 357/43 |
| 4,502,069 | 2/1985 | Schuh | 257/341 |
| 4,597,824 | 7/1986 | Shinada et al. | 156/643 |
| 4,599,118 | 7/1986 | Han et al. | 148/1.5 |
| 4,672,407 | 6/1987 | Nakagawa et al. | 357/23.4 |
| 4,721,990 | 1/1988 | Kinoshita | 357/41 |

*Primary Examiner*—Mark V. Prenty
*Attorney, Agent, or Firm*—Ostrolenk, Faber, Gerb & Soffen

[57] ABSTRACT

A process for producing a radiation resistant power MOSFET is disclosed. The gate oxide is formed toward the end of the processing and is not exposed to substantial thermal cycling. Arsenic doping is used in the early part of the process to form the source region, and diffused too slowly to be adversely affected by later thermal cycling process steps. The source region has a relatively high resistance to act as a ballasting resistor to prevent burnout of one of a large number of parallel connected cells.

7 Claims, 4 Drawing Sheets

5,475,252

PROCESS FOR MANUFACTURE OF RADIATION RESISTANT POWER MOSFET AND RADIATION RESISTANT POWER MOSFET

This is a continuation of application Ser. No. 07/001,629, filed Jan. 8, 1987 and now U.S. Pat. No. 5,338,693.

BACKGROUND OF THE INVENTION

This invention relates to a method of manufacture for a radiation resistant power MOSFET and the resulting power MOSFET device.

Metal oxide semiconductor field effect transistors ("MOSFETs") are well known. One well known MOSFET is manufactured and sold by the International Rectifier Corporation of El Segundo, Calif., (the Assignee of the present application), under its Registered Trademark HEXFET®. The structure of such power MOSFETs and a method of manufacture therefor is shown in U.S. Pat. No. 4,593,302, dated Jun. 3, 1986, in the names of Alexander Lidow and Thomas Herman.

When MOSFETs are subjected to radiation, several of their characteristics are modified and degraded. For example, ionizing radiation is known to induce charges into the gate oxide, which produces a shift in gate-to-source threshold voltage. Gate-to-source threshold voltage decreases with increasing total radiation dose for N channel devices, and increases with total dose for P channel devices. The gate drive circuitry must be designed to offset these threshold voltage shifts by overriding them with appropriate biasing levels. This complicates the control circuitry. A description of the shift in threshold voltage is described in more detail in a paper entitled "Radiation Resistance of HEXFETs," contained at pages B-10 through B-12 of the HEXFET Databook of 1985, published by the International Rectifier Corporation of El Segundo, Calif.

A power MOSFET having a more constant threshold voltage for a total radiation dose, up to 1 megarad, would be very desirable since it would simplify the gate drive circuitry.

In addition to the total dose dependent characteristics which are mentioned in the above reference, it is also known that the device breakdown voltage can degrade. A power MOSFET having a more constant breakdown voltage for a total dose, up to 1 megarad, would also be desirable because the device breakdown voltage need not be derated as much. This may result in a device selection which has a lower on resistance for the designer.

The shift in gate-to-source threshold voltage described above occurs at all dose rates. Power MOSFET applications in free space environments are particularly susceptible to radiation induced threshold shifts. At higher dose rates, for example, $1\times10^9$ through $1\times10^{13}$ rads/second, a failure mode appears, termed burnout, which is like avalanche energy failure. In this failure mode, the parasitic bipolar transistor of one or more cells of a multicellular vertical conduction MOSFET (which has thousands of parallel cells in a common chip) appears to have turned fully on and then hogs all current flow through the device until it is destroyed. Such high dose rates can be produced by nuclear explosions which, for example, may generate ionizing radiation at $10^{12}$ rads/second.

It would be very desirable to prevent the burnout effect due to a high ionizing dose rate.

A further source of device degradation due to radiation is that caused by a neutron flux. Neutrons cause physical damage to the silicon body of the device 10 which increases the on-resistance of the device. This effect is greater with higher resistivity silicon. Since higher rated voltage devices are produced by using higher resistivity silicon, the effect is most pronounced in higher voltage rated devices. Thus, devices rated at 100 volts, employing 1.5 ohm/cm material are only slightly affected, while devices rated at 400 volts, employing 15 ohm/cm material show a two and one-half fold increase in on resistance for a neutron fluence of $10^{14}$ neutrons/cm$^2$.

It would be very desirable to provide a high power MOSFET which has a relatively high voltage rating but will not have a too greatly degraded on resistance when exposed to a high neutron flux.

BRIEF DESCRIPTION OF THE INVENTION

In accordance with the invention, a high power vertical conduction MOSFET is made by a process which drastically reduces its susceptibility to change of gate-to-source threshold voltage and to burnout due to ionizing radiation; and which is rated at a voltage at which on-resistance is not substantially increased by high neutron flux.

In accordance with a first feature of the invention, the gate oxide, which ordinarily is formed at an early stage of the manufacturing process, is formed late in the process and is not subjected to high temperature processing steps, which steps are carried out before the gate oxide is formed. Oxide which has been subjected to high temperature processing steps, or thermal cycling, is known to be more susceptible to capturing positive charge in the presence of ionizing radiation. By forming the oxide late in the process, it will be far less susceptible to gate-to-source threshold voltage shift for total doses of up to $1\times10^6$ rads and, indeed, remains relatively constant. The resulting device does not use a self-aligned gate, and, therefore, is somewhat larger in area than a prior art device employing a self aligned gate with gate oxide formed early in the manufacturing process. The benefit of reduced threshold shift, however, outweighs this drawback for devices to be used in an environment containing a high radiation background.

A second important feature of the invention is the use of an arsenic dopant, or other relatively slow diffusing atom, in place of phosphorous to form the N type source region of an N channel device. In prior processes, the source region was formed late in the process, and was not subject to the high drive temperatures of subsequent process steps. Since the present invention delays the deposition of the gate oxide to a later process step, the source region must be formed earlier, and is subjected to later, high temperature process steps. Since arsenic diffuses more slowly than phosphorous, it can be applied in an early process stage and will not drive too deeply during the subsequent high temperature processing steps. Moreover, the arsenic is ion implanted to enable very good control of total dose, not to be confused with radiation threshold shift due to "total dose".

A third important feature of this invention lies in making the source region surface a higher resistivity than the relatively low resistivity (N+) source region of the prior art. By increasing the source resistivity, it becomes a "ballasting" resistor in series with its annular MOSFET channel. Thus, each of the thousands of parallel connected cells in a given device will have a small series resistor. These resistors will act as current divider resistors (or ballasting resistors) and will tend to prevent current "hogging" of one or a few cells in the presence of a large radiation rate, for example, $10^{12}$ rads/second, leading to burnout of the device. While the device will have a slightly increased on-resistance when using higher resistance source regions, this drawback is more than offset by the improved resistance to radiation-induced burnout.

A further important feature of the invention is in the manner in which the gate oxide is grown. It is known that pyrogenic (wet steam) oxides grown at 900° C. and oxides grown at 975° C. in dry oxygen have improved radiation hardness. In accordance with the invention, such oxides are grown at a late time in the process cycle. These oxides may be annealed in a novel manner for 30 minutes in nitrogen or dry oxygen or forming gas to further improve their radiation hardness. However, other growth times can be used without departing from the invention.

In accordance with a further important feature of the invention, a novel contact is made from the source electrode to the surface of the N type channels. In a first embodiment, a higher or N+ conductivity ring is formed around the inner periphery of the higher resistance source region which defines the ballasting resistance described above. The N+ ring enables solid ohmic connection to the source metal. In accordance with a second embodiment of this aspect of the invention, a Schottky contact is made directly from the relatively high resistivity source region surface to the aluminum source metal.

DETAILED DESCRIPTION OF THE INVENTION

The Figures show the manner in which an N channel device can be manufactured in accordance with the invention. It will be obvious to those skilled in the art that P channel devices can similarly be formed, making appropriate modifications in the conductivity types which are defined by the process.

Figure 1:
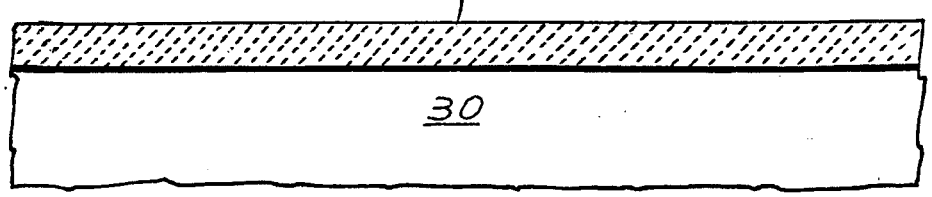
FIG. 1 is a cross-section of a chip of silicon which is to be processed in accordance with the invention and after the growth of a field oxide.

Referring first to FIG. 1, there is shown a portion of a wafer of monocrystalline silicon having an epitaxially deposited layer 30 thereon. In the usual fashion, a large number of identical devices will be fabricated in a common wafer which is later diced to produce individual devices which are appropriately housed. The epitaxial layer 30 may have a resistivity of 6.8–7.8 ohm/cm for the manufacture of power MOSFET device having a reverse breakdown voltage of 250 to 300 volts.

Before processing is begun, a sacrificial field oxide having a thickness of about 7000 angstroms may be first grown on the surface of layer 30 and thereafter etched away, thus insuring a clean surface. Thereafter, the first step of the process shown in FIG. 1 is carried out, which is the formation of the field oxide 31 having a thickness of 14,000 angstroms. Any standard oxide growing process can be used.

Figure 2:
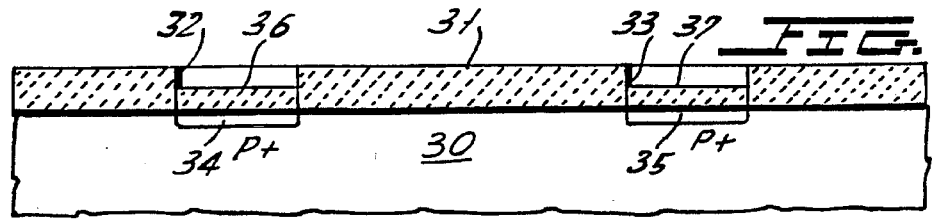
FIG. 2 shows the chip of FIG. 1 after the first mask operation and the ion implantation of a dose of boron atoms.

Thereafter, a first mask is applied to the surface of oxide 31 and an oxide etch is carried out to cut arcular openings, shown as openings 32 and 33 in FIG. 2, in the oxide layer 31. The cells are spaced on centers which are spaced apart by 38 microns. These openings are arranged in a regular pattern over the full surface of the device and define the centers of each of the individual MOSFET cells which are to be formed in the device. Typically, 22,000 openings such as openings 32 and 33 can be formed in a typical device (or die). A 5 inch wafer is later diced into 240 individual die.

After the openings 32 and 33 have been formed, a boron ion implant step is carried out in which boron ions having an energy of 120 kv are implanted through the openings at a flux of about $7 \times 10^{14}$ ions per $cm^2$. After the implant step, the boron ions are driven at a temperature of 1050° C. for 100 minutes, thereby forming the shallow P+ regions 34 and 35 respectively in FIG. 2. At the same time, regrown oxide layers, shown as layers 36 and 37, are formed over the bottom surfaces of the openings formed by windows 32 and 33. Oxide layers or dots 36 and 37 are grown to a thickness of about 5000 angstroms.

Figure 4:
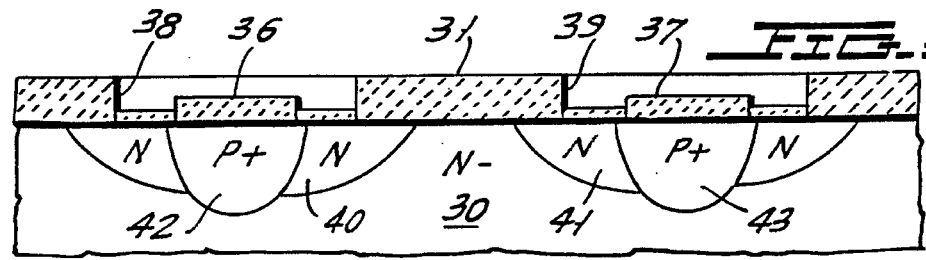
FIG. 4 is a cross-sectional view of FIG. 3 taken across section lines 4—4 in FIG. 3 in which phosphorous atoms are ion implanted and driven to form an N type region.
Figure 3:
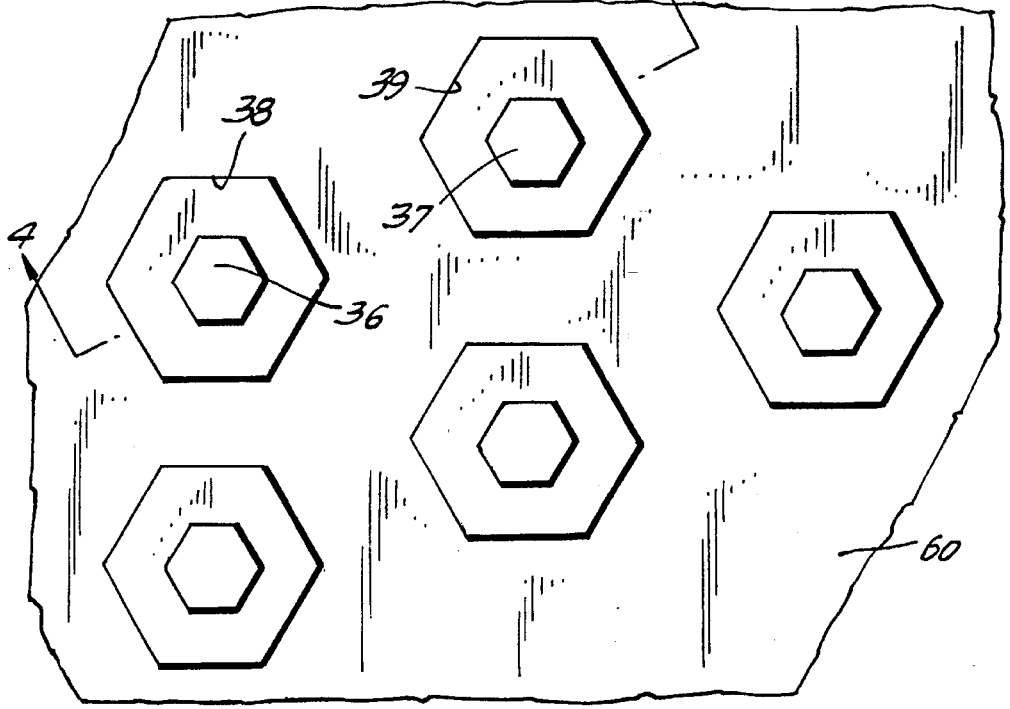
FIG. 3 is a plan view of the chip of FIGS. 1 and 2 after a second mask operation in which an array of hexagonal openings are etched through the field oxide.

Thereafter, a second masking step is carried out to form the geometry shown in FIGS. 3 and 4. More specifically, in the second masking step, hexagonal openings having a perpendicular distance between parallel flats of about 23 microns are etched in regions coaxial with the centers of the openings 32 and 33. Two such openings 38 and 39, associated with dots 36 and 37, are shown in FIGS. 3 and 4. The geometric pattern of the surface of the entire wafer is partially shown in FIG. 3. During this etching operation, the diameter of the oxide dots 36 and 37 is reduced to about 11 microns. The step carried out with the second mask shown in FIGS. 3 and 4 is not self-aligned. The step of FIGS. 3 and 4 is used to define the channel and source diffusions as will now be described.

An enhanced drain region is first formed, as shown in FIG. 4, by a phosphorous ion implant step. Thus, phosphorous ions are implanted through the annular window formed between the periphery of windows 38 and 39 and the central dots 36 and 37, respectively. The implanting operation takes place at about 120 kv with a flux of about $1\times10^{12}$ ions/cm$^2$. The annular window has a radial dimension from the outer peripheral surface of dots 36 and 37 of about six microns in FIG. 4.

Thereafter, the implanted phosphorous is driven at about 1200° C. for about 100 minutes. During this drive operation, the N+ regions 40 and 41 are formed and, at the same time, the P+ regions 34 and 35 increase in depth and become the deeper regions 42 and 43 respectively.

Thereafter, a boron implant is carried out in which boron atoms at an energy of 80 kv and a flux of $1-10\times10^{13}$ ions/cm$^2$ are implanted through the same annular windows of FIG. 4 for about 0.1 minute. These ions are then driven at a temperature of 1175° C. for about 120 minutes, thereby to define the P+ channel regions 44 and 45 shown in FIG. 5.

The resulting cell structure at this stage of the manufacture is a P type channel region which has an outer N type shell. The outer N type shell will act in the manner of the increased conductivity region of U.S. Pat. No. 4,593,302 and is employed to reduce the on-resistance of the device, in part, by reducing the effect of the parasitic JFET formed by P region 44, N-region 30 and P region 45. The increased conductivity of N type shells 40 and 41 (relative to the N-material of body 30) reduces the efficiency of the parasitic JFET gate and prevents its pinching off or depleting the channels between the cells, which would increase the on-resistance.

Figure 5:
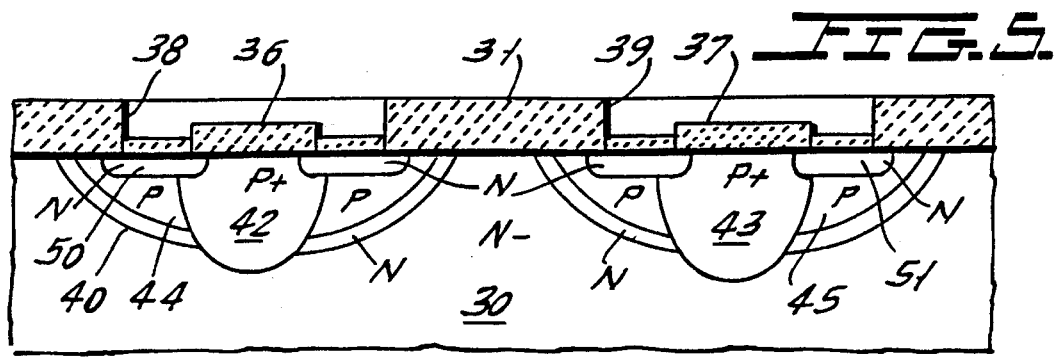
FIG. 5 shows the chip of FIG. 4 in which boron atoms were implanted and driven through the opened window, followed by implantation of arsenic atoms and an anneal step.

After the boron implant and drive, the source regions are formed by implanting arsenic atoms through the window in FIG. 5 at an energy of 50 kv and flux of $1-50\times10^{14}$ ions/cm$^2$. Note that this step employs arsenic rather than the more conventional phosphorous. Arsenic is employed since it will diffuse more slowly than phosphorous, so that the source regions will not unduly deepen during subsequent high temperature processing steps. The arsenic atoms define the N type source regions 50 and 51 which are annular regions surrounding the P+ regions 42 and 43.

Following this operation, an annealing step is carried out wherein the wafer is heated at about 975° C. for 20 minutes in nitrogen gas, and thereafter for 100 minutes in dry oxygen while the temperature is ramped down. It is important to note that the gate oxide still has not been applied to the device and is not subject to any thermal cycling to this point.

Figure 6:
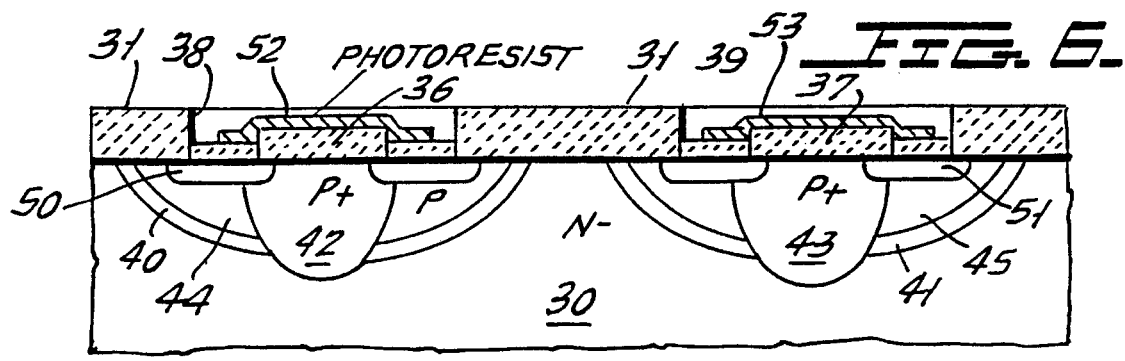
FIG. 6 shows the chip of FIG. 5 after the third mask operation which leaves a photoresist over the central oxide button of each cell.
Figure 7:
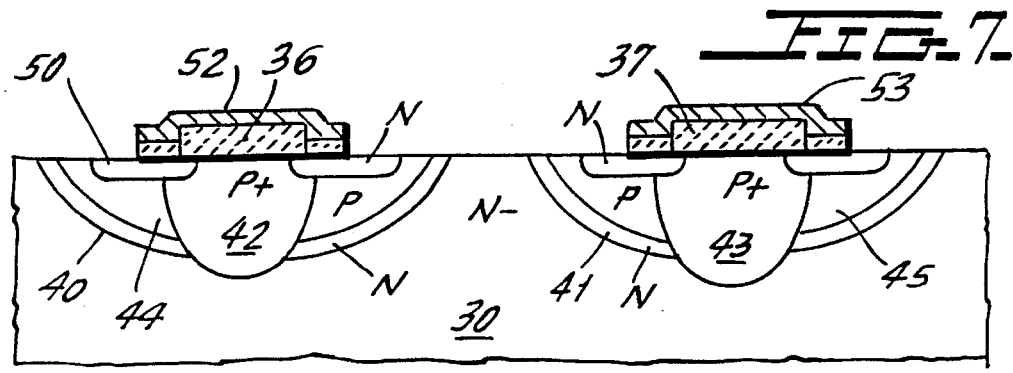
FIG. 7 shows the chip of FIG. 6 after an oxide etch step.

The wafer of FIG. 5 is then subjected to a third mask step in which the mask is provided with openings to enable the formation of a photoresist coating over the various dots 36 and 37. The photoresist coating is shown in FIGS. 6 and 7 as the photoresist coatings 52 and 53. All exposed oxide is then removed by an appropriate oxide etch as shown in FIG. 7.

Thereafter, the photoresist layers 52 and 53 are stripped and the wafer may be etched lightly in order to thin down the oxide dots 36 and 37 to a height of about 3000 angstroms. It will be noted that the photoresist dots which overlie dots 36 and 37 have a diameter of about 14 microns to ensure that the dots will be covered even if there is misalignment between the dot center and the center of the opening in the mask used to define the photoresist diameter.

Figure 8:
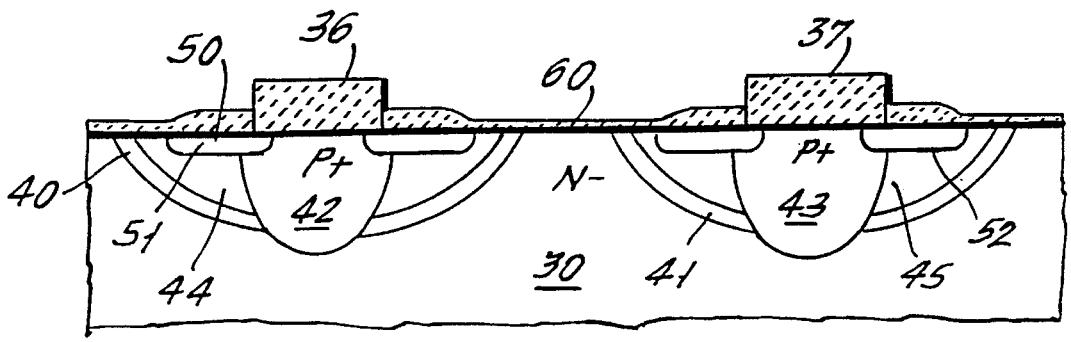
FIG. 8 shows the chip of FIG. 7 after photoresist stripping and the deposition of the thin gate oxide layer.

The wafer is then processed for the development of the gate oxide coating. The gate oxide coating is shown in FIG. 8 as the oxide coating 60 which has a thickness of about 700–900 angstroms. The oxide is somewhat thicker where it overlies the arsenic doped source regions because silicon oxide grows faster over arsenic rich silicon. The thinnest oxide layer possible is grown, since the thinner oxides will have a reduced total dose threshold shift in the presence of a radiation dose. As pointed out previously, by growing the gate oxide at the step of FIG. 8 in the manufacturing process, there is a substantial reduction of postoxidation thermal cycling at high temperature, which would make the device more sensitive to radiation.

Figure 9:
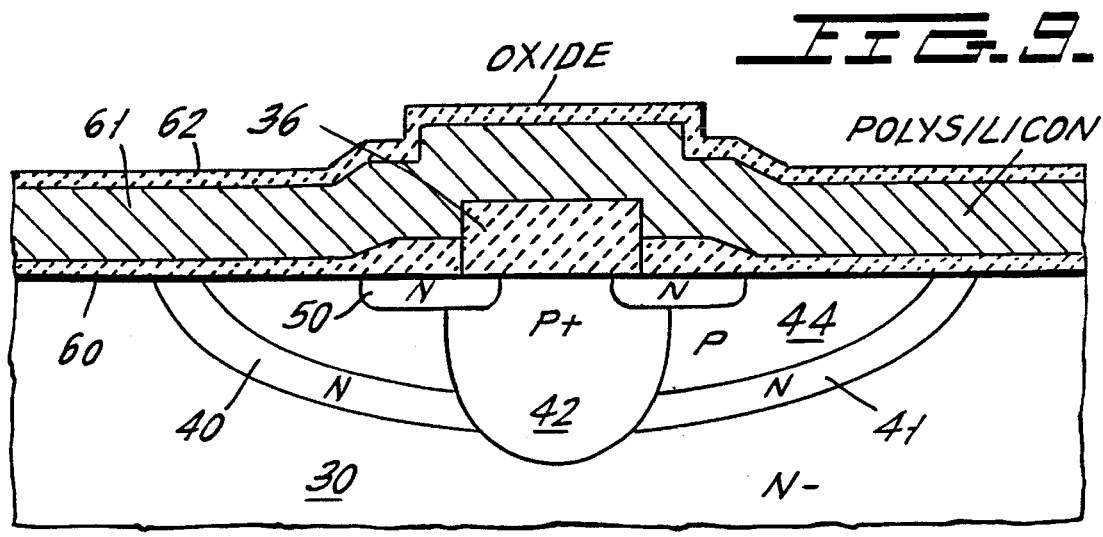
FIG. 9 shows the chip of FIG. 8 after the deposition of a polysilicon layer and a thin oxide coating thereon.

Following the formation of the gate oxide coating 60, and as shown in FIG. 9, a polysilicon layer 61 is formed over the device surface. Next, POCl is deposited onto the polysilicon layer. The deposition takes place at about 925° C. to heavily dope the polysilicon gate electrode layer. The polysilicon layer 61 is then covered by a very shallow oxide layer 62 which can have a thickness, for example, of about 500 angstroms and is used so that it can serve as a mask to pattern the polysilicon 61 in a later step.

Figure 10:
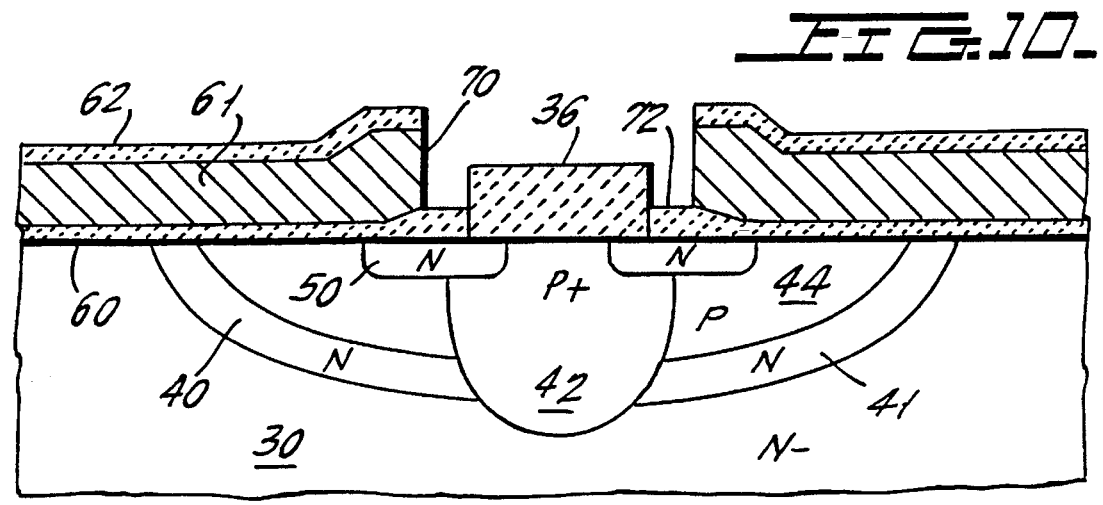
FIG. 10 shows the fourth mask step for patterning the polysilicon.

A fourth masking step employs a mask to pattern the polysilicon to open hexagonal openings such as opening 70 in FIG. 10 at each of the cell sites. The opening 70 has a diameter from flat to flat (perpendicularly to the parallel flats of the hexagonal cell), of about 21 microns. The interior edges of the windows 70 slightly overlap the thickened oxide coating 72 over the source regions 50. Consequently, the polysilicon 61 is farther removed from the surface of the silicon 30 to reduce input capacitance.

The oxide coating 72 can further be thickened at this point to further reduce input capacitance and to form a diffusion barrier. The diffusion barrier may be necessary if a POCl deposition is used to make good ohmic contact to the source electrode. The barrier thus prevents heavy doping of the source except where intended. The thickening of coating 72 is typically carried out at 900° C. in a pyrogenic steam ambient for 15–45 minutes. This also oxidizes the polysilicon sidewalls forming a conforming oxide. This improves gate reliability.

Thereafter, a fifth masking step is carried out in which a photoresist coating 71 is formed over the surface of the wafer but exposes an opening 14 mils in diameter at a position overlying the oxide coating 60 and oxide button 36. Note that the oxide button 36 in FIG. 10 is considerably greater in thickness than the increased thickness region 72 of the gate oxide coating 60 overlying the source region 50. More specifically, region 72 is about 1500 angstroms thick, whereas the button 36 in FIG. 10 is about 3000 angstroms thick.

Figure 11:
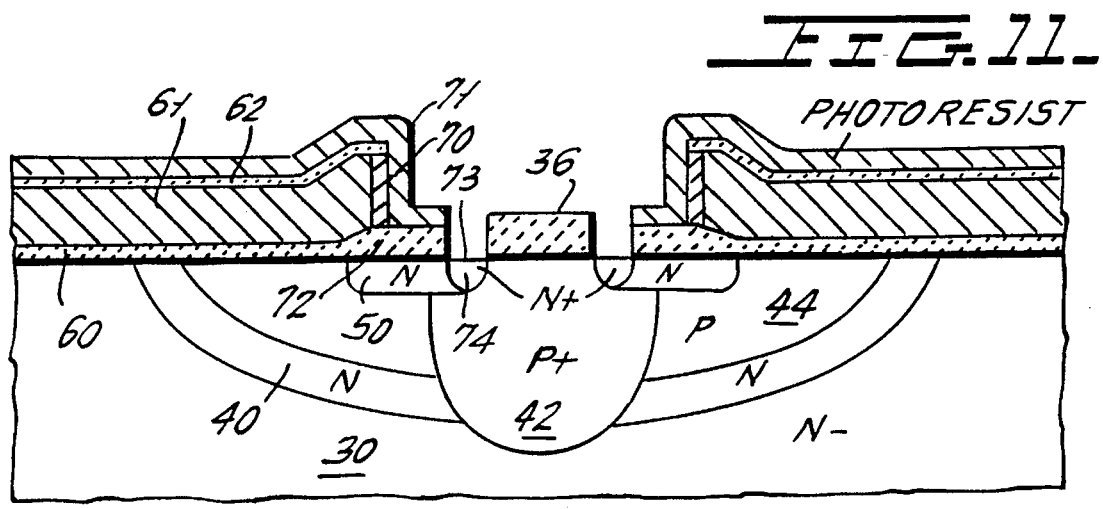
FIG. 11 shows the fifth mask step in which an annular opening is formed around the central oxide dot and a low temperature POCl deposition forms an annular N+ ring around the central oxide dot of each cell.

An etching step is then carried out which, as shown in FIG. 11, reduces the height of the button 36 to about 1500 angstroms and forms an annular notch 73 extending down to the surface of the silicon 30. Notch 73 is defined between the remainder of button 36 and the increased thickness region 72 of the oxide layer.

After forming the notch 73, the photoresist layer 71 is stripped (shown in place in FIG. 11), and POCl is deposited over the wafer but is not driven. The deposition takes place at about 925° C. to produce a small drive which acts to create the annular N+ ring 74 around the interior of the N type, and less conductive, annular source 50. Note that the processing to form this ring 74, which is used to make good contact to the source electrode produces no adverse thermal cycling on the gate oxide 60.

Figure 12:
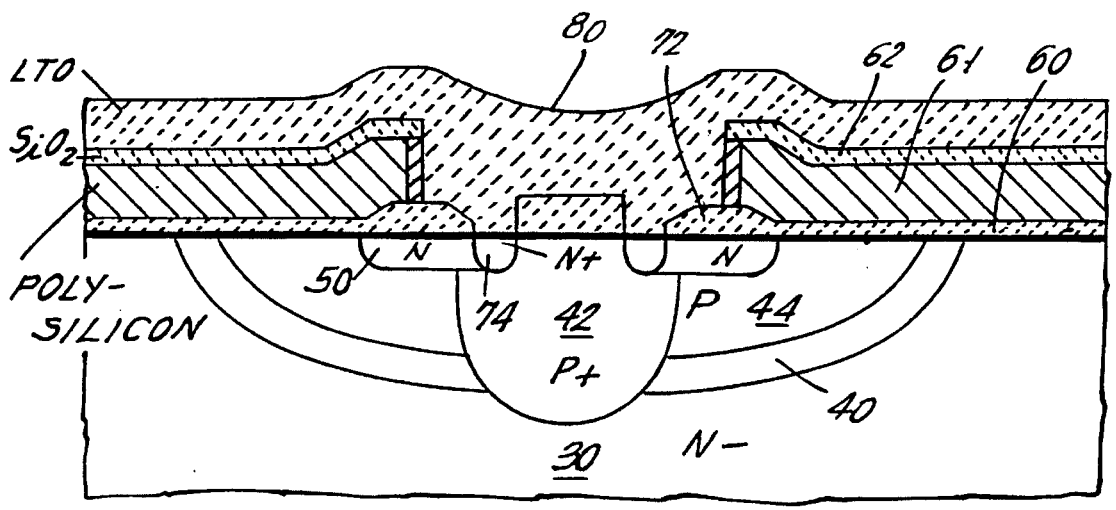
FIG. 12 shows the chip of FIG. 11 after the deposition of an LTO layer and reflow thereof.

Thereafter, LTO (phosphorous doped silicon dioxide) (which could be used to form the N+ ring 74) is formed over the device surface as shown in FIG. 12. The LTO layer 80 is then subjected to about 900° C. in a wet atmosphere for about one hour to obtain the desired reflow of the LTO material. This again does not adversely affect the gate oxide 60. Note that the oxide region 72 is thick enough to keep the phosphorous and the LTO layer from diffusing through. A thickness of about 1500 angstroms for region 72 is sufficient for this purpose.

Figure 13:
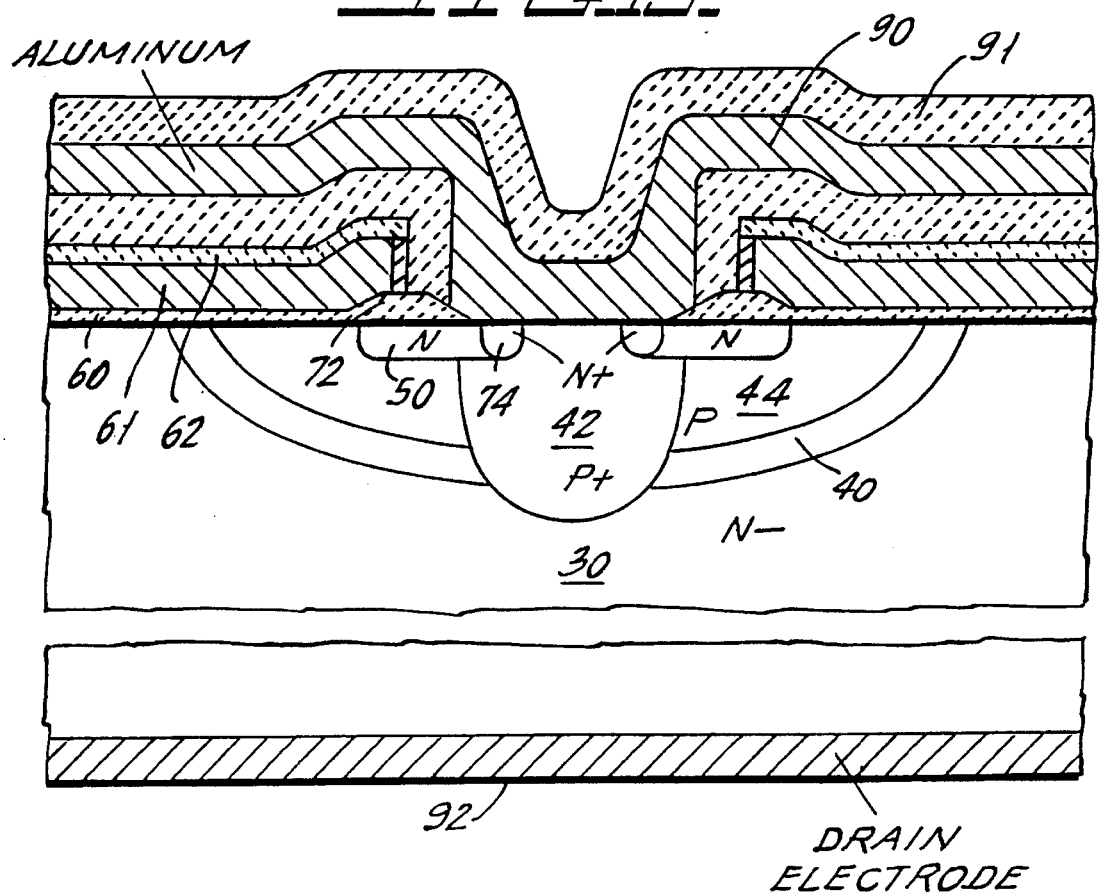
FIG. 13 shows the chip of FIG. 12 after the sixth mask step in which windows are pierced in the LTO layer, an aluminum contact is deposited over the device surface, and after a surface passivation layer is formed thereon.

Thereafter, and as shown in FIG. 13, a sixth masking operation takes place in which mask openings, each about 10 microns in diameter, are located over the center of the P regions 42 to form openings for exposing the silicon for a contact deposition operation. An aluminum layer 90 is then deposited over the surface and makes contact with the P+ dots 42 and the source region 50, including its high conductivity interior annulus 74.

Thereafter, conventional steps are carried out to complete the chip structure, including an etching operation which patterns the aluminum coating 90 to define and separate the source electrode from gate bus fingers as disclosed in U.S. Pat. No. 4,593,302. A scratch coating, which is a surface passivation consisting of phosphorous doped glass having lower phosphorous concentration than LTO, is then formed as the layer 91 in FIG. 13.

Thereafter, a further masking operation is carried out to define a connection pad etch and to form the backside metal, comprising the drain electrode 92, shown in FIG. 13.

In the manufacture of the device as described above, it will be apparent that a very thin gate oxide has been provided which is not subjected to substantial thermal cycling, thereby being less sensitive to radiation damage. Indeed, the device exhibits a relatively flat curve of threshold gate-to-source voltage as a function of total radiation up to and exceeding 1 megarad. The use of arsenic for the formation of the source is extremely useful, since it provides the desired ballasting action, described above, by forming a relatively high resistance source. By relatively high resistance is meant a resistance of from 50 ohms per square to 500 ohms per square. However, good ohmic contact is made to the source because the novel N+ ring 74 contacts the source electrode.

The device, preferably, but not necessarily, is rated at less than about 300 volts, thereby making it maximally resistant to damage due to neutron irradiation. This is done by specifying the resistivity of the epitaxial layer 30 to 6.8–7.8 ohms/cm and an epitaxial thickness of about 33±3 microns, corresponding to about 300 volts break down voltage rating.

In putting down the gate oxide, the gate oxide can preferably be grown in one of several ways. It can be grown at 900° C. in wet steam without anneal, or can be grown in 975° C. or 1000° C. dry oxygen with no anneal. Both of these methods are known to produce enhanced radiation hardness. Other techniques which can be used are growing the oxide layer 60 at 900° C. in wet steam followed by an anneal at 900° C. in nitrogen. Alternatively, the oxide layer can be grown at 900° C. in wet steam with a dry oxygen gas anneal at 900° C. Both of these processes can enhance radiation hardness. Also the oxide layer can be grown in 975° C. or 1000° C. dry oxygen and annealed in nitrogen or forming gas. These processes can also enhance radiation hardness.

While the contact to the source electrode has been disclosed as a galvanic or ohmic contact, it is also possible to use a Schottky contact in which the relatively high resistivity source region is directly connected to the aluminum metal. This produces a very inefficient, leaky Schottky contact, which will have an increased resistance and will produce good ballasting for the numerous parallel connected source regions of a given device.

Although the present invention has been described in connection with a preferred embodiment thereof, many variations will now become apparent to those skilled in the art. It is preferred, therefore, that the present invention be limited not by the specific disclosure herein, but only by the appended claims.

What is claimed is:

1. A MOS-gated semiconductor device having short-circuit current limiting ballasting; said MOS-gated semiconductor device comprising a die of monocrystalline silicon having flat parallel upper and lower surfaces and having a body region extending from said upper surface which is of one conductivity type; a plurality of laterally spaced channel regions of the opposite conductivity type extending from said upper surface of said die and into said body region; a respective source region for each of said channel regions; said source regions being of said one conductivity type and extending from said upper surface of said die into their said respective channel regions for a depth less than the depth of their said respective channel regions; a gate electrode means disposed atop said upper surface and insulated from said spaced channel regions and operable to invert said spaced channel regions in response to the application of a suitable gate voltage to said gate electrode means; a metallic electrode disposed atop said upper surface and connected to at least each of said source regions; each of said source regions having at least a relatively high resistance portion disposed in series with the current path extending from said metallic electrode through said channel regions and to said body region; said metallic electrode forming a Schottky barrier connection of increased resistance to said relatively high resistance portions of said source regions to act as respective ballasting resistors in parallel with one another and to limit short-circuit current.

2. The MOS-gated semiconductor device of claim 1 in which said source regions are formed by arsenic impurity atoms.

3. The MOS-gated semiconductor device of claim 1 in which said relatively high resistance portions of said source regions have a resistance approximately equal to the resistance produced by implanting arsenic atoms at an energy of 50 kv and flux of $1\text{--}50 \times 14^{14}$ ions/cm$^2$.

4. The MOS-gated semiconductor device of claim 2 in which said relatively high resistance portions of said source regions have a resistance approximately equal to the resistance produced by implanting arsenic atoms at an energy of 50 kv and flux of $1\text{--}50 \times 10^{14}$ ions/cm$^2$.

5. The MOS-gated semiconductor device of claim 1 which further includes a relatively low resistance region in said source region; said relatively low resistance region being ohmically connected to said metallic electrode to define a reduced resistance connection from said source electrode to a portion of each of said source regions; said relatively high and low resistance regions of said source regions being disposed in series in the connection from said respective channel regions to said metallic electrode.

6. The MOS-gated semiconductor device of claim 5 in which said source regions are formed by arsenic impurity atoms.

7. The MOS-gated semiconductor device of claim 6 in which said relatively high portions of said source regions have a resistance approximately equal to the resistance produced by implanting arsenic atoms at an energy of 50 kv and flux of $1\text{--}50 \times 10^{14}$ ions/cm$^2$.

* * * * *